United States Patent [19]
Maneatis

[11] Patent Number: 5,727,037
[45] Date of Patent: Mar. 10, 1998

[54] SYSTEM AND METHOD TO REDUCE PHASE OFFSET AND PHASE JITTER IN PHASE-LOCKED AND DELAY-LOCKED LOOPS USING SELF-BIASED CIRCUITS

[75] Inventor: John George Maneatis, Redwood City, Calif.

[73] Assignee: Silicon Graphics, Inc., Mountain View, Calif.

[21] Appl. No.: 592,736

[22] Filed: Jan. 26, 1996

[51] Int. Cl.[6] .................................................. H03D 3/24
[52] U.S. Cl. ........................ 375/376; 375/374; 375/375
[58] Field of Search ............................... 375/376, 374, 375/375, 327, 215, 296; 331/17, 185, 18, 25; 327/157, 156, 147, 148, 116

[56] References Cited

U.S. PATENT DOCUMENTS

| | | | |
|---|---|---|---|
| 4,719,558 | 1/1988 | Hirata et al. | 363/98 |
| 5,043,677 | 8/1991 | Tomassetti et al. | 331/2 |
| 5,075,639 | 12/1991 | Taya | 331/2 |
| 5,126,693 | 6/1992 | Gulliver et al. | 331/14 |
| 5,233,314 | 8/1993 | McDermott et al. | 331/17 |
| 5,259,007 | 11/1993 | Yamamoto | 375/376 |
| 5,375,148 | 12/1994 | Parker et al. | 375/376 |
| 5,446,416 | 8/1995 | Lin et al. | 331/11 |
| 5,513,225 | 4/1996 | Kelkar et al. | 375/376 |
| 5,572,167 | 11/1996 | Alder | 375/376 |
| 5,629,650 | 5/1997 | Gersbach et al. | 331/17 |

OTHER PUBLICATIONS

Gardner, Floyd M., "Charge-Pump Phase-Lock Loops," *IEEE Transactions on Communications*, vol. Com-28, No. 11, pp. 1849-1858, Nov. 1980.

Waizman, Alex, "FA18.5: A Delay Line Loop for Frequency Synthesis of De-Skewed Clock," *IEEE International Solid-State Circuits Conference*, pp. 298-299, 1994.

Maneatis, John G. and Mark A. Horowitz, "Precise Delay Generation Using Coupled Oscillators," *IEEE Journal of Solid-State Circuits*, vol. 28, No. 12, pp. 1273-1282, Dec. 1993.

Young, Ian A. *et al.*, "A PLL Clock Generator with 5 to 110 MHz of Lock Range for Microprocessors," *IEEE Journal of Solid-State Circuits*, Vol. 27, No. 11, pp. 1599-1607.

*Primary Examiner*—Stephen Chin
*Assistant Examiner*—Betsy L. Deppe
*Attorney, Agent, or Firm*—Sterne, Kessler, Goldstein & Fox P.L.L.C.

[57] ABSTRACT

A system and method for using self-biased circuits to reduce phase jitter and phase offset in phase locked loops and frequency is disclosed. A self-biased apparatus for aligning a reference signal having reference phase with a feedback signal having a feedback phase includes a phase-frequency detector for comparing the reference phase and the feedback phase. The phase-frequency detector produces a phase-frequency detector output proportional to a difference between the reference phase and the feedback phase. A charge pump, coupled to the phase-frequency detector, outputs a charge pump output in response to the phase-frequency detector output. A loop filter, coupled to the charge pump, filters the charge pump output to produce a control voltage. A bias generator is coupled to the loop filter to generate a bias signal to bias the charge pump, causing the charge pump to generate a bias voltage substantially equivalent to the control voltage. The bias voltage is sufficient to cause the charge pump to output substantially zero current when the reference phase substantially equals the feedback phase. A voltage-controlled element, coupled to the phase-frequency detector and the bias generator, is controlled by the control voltage to modify the feedback signal having the feedback phase such that the feedback phase and the reference phase are substantially aligned. The invention may be implemented as part of a multiple loop apparatus including a first loop to generate a first loop output signal having a frequency that is substantially equal to an integral multiple, N, of the frequency of the input signal and a second loop, coupled to the first loop, to generate a second loop output signal from said first loop output signal, wherein the second loop output signal is substantially in phase with the input signal and has a frequency substantially equal to the integer multiple, N, of the frequency of the input signal.

22 Claims, 8 Drawing Sheets

SYSTEM AND METHOD TO REDUCE PHASE OFFSET AND PHASE JITTER IN PHASE-LOCKED AND DELAY-LOCKED LOOPS USING SELF-BIASED CIRCUITS

BACKGROUND OF THE INVENTION

1. Field of the Invention

The present invention relates generally to phase-locked loops and delay-locked loops. More particularly, the present invention relates to a system and method to reduce phase offset and phase jitter in phase-locked and delay-locked loops.

2. Related Art

Digital circuit designers must often interface one integrated circuit (IC) chip to another. A common problem encountered by such designers is that of synchronizing different clock domains.

One method of solving this problem is to use a centrally distributed clock. In centrally distributed clock systems, a single centralized clock source provides a clock signal to all IC chips in the system. Unfortunately, guaranteeing system timing in a centralized clock system is difficult. For example, consider the following clocked dam transfer. A first IC chip generates a clock signal. The first IC chip transmits the clock signal to a second IC chip to support a clocked data transfer. A clock receiver latch on the second IC chip receives the clock signal. A data receiver latch receives the data. Both the clock receiver latch and the data receiver latch have a setup and hold time for valid latching of a signal (clock or data) they receive. The data receiver latch uses the clock signal from the clock receiver latch to latch the data. If the clock signal arrives outside of a data setup and hold time window for the receiver latch on the second IC chip, the data will not be properly latched into the second IC chip.

A second problem inherent in a centralized source clock system is delay. The delay results from a large load that is placed on the clock signal by distribution of the clock signal. The load results not only from the number of devices that the clock signal must drive, but also the length of the conductor that the clock signal must travel. Data coming on to the second IC chip does not see such a load because it only drives the data receiver latch. Thus, the data and clock have an inherent skew with respect to one another due to the delays caused by the different loads they experience on the second IC chip.

To overcome the above problems of systems designed using a centrally distributed system clock, digital designers employ a clock synchronization circuit. Examples of such clock synchronization circuits include phase-locked loops (PLL) and a delay-locked loops (DLL). Conceptually, PLL and DLL circuits operate similarly. The primary difference lies in the type of voltage control element employed in the circuit. A PLL uses a voltage controlled oscillator to match both frequency and phase. A DLL uses a voltage controlled delay line to match delay. Several problems inherent in PLLs are discussed below. Due to the similarity between DLLs and PLLs, these problems are often encountered in DLL designs as well.

A PLL has two inputs and one output. The inputs are a reference input and a feedback input. The PLL outputs a signal having a phase substantially equal to the reference input.

A PLL may be used to synchronize different clock domains as follows. The clock signal is input to the PLL as the reference input. The output is buffered in order to drive the large drive load experienced by the clock. The buffered output is fed back into the PLL as the feedback input. In this configuration, the PLL assures that the clock signal and buffered output are in phase. In essence, then, the PLL subtracts out the uncertainty introduced in the centralized source clock system due to large loads. Thus, data and clock see the same delay because the in-phase buffered output is used to clock data onto the second IC chip.

Unfortunately implementation of the PLL introduces a new set of problems. Disregarding the difficulty in designing PLLs, the primary problem concerns the output characteristics of the PLL. PLLs often exhibit jitter. Jitter is phase noise that occurs during the operation of a PLL. A second problem is offset. Offset means that the output signal edge leads or lags the reference by some time. Offset can occur even when the PLL indicates it is in a phase-locked condition.

The high noise environments of modem digital systems compound the aforementioned problems encountered with PLLs. High switching activity in digital systems contributes to both high substrate noise and high supply noise. This noise couples into the PLL, thereby modulating the output and producing jitter. Noise is not the only consideration. The cycle time of modem digital systems is rapidly decreasing. Thus, jitter as a function of the percentage of a cycle is increasing. Furthermore, system tolerances, in terms of setup and hold times have also dramatically decreased.

To guarantee stability, a PLL's loop bandwidth must be approximately a factor of ten below the lowest possible operating frequency. Even more cushion is required to guarantee stability when considering the effect of processing parameters and temperature.

In order to achieve the low loop bandwidth requirement, the PLL must implement a large on-chip capacitor as its loop filter. A problem with a conventional PLL design it that the required capacitor may be very expensive in terms of die area. Without the large capacitor however, the PLL will not work.

There exists a counterbalancing consideration to the low bandwidth requirement. This consideration concerns jitter. Jitter is inversely related to bandwidth. As a result, a PLL designer tries to make the loop bandwidth as high as possible. However, as just noted, the bandwidth is limited to a factor of 10 below the lowest possible loop operating frequency plus a cushion for the effect of processing parameters.

What is required, therefore, is a PLL and DLL designed to operate in the high noise environment of modem digital systems. The PLL and DLL must reduce jitter to an acceptable level or eliminate it entirely. Furthermore, the PLL design must include sufficient flexibility such that a designer can be very aggressive in setting the loop bandwidth as close to the factor of ten below the lowest loop operating frequency as possible.

SUMMARY OF THE INVENTION

The present invention uses self-biased circuits having a unique control relationship to substantially reduce phase jitter and phase offset in delay-locked and phase-locked loops. Self-biasing means that the circuits generate all biasing themselves. In addition, the generated biasing changes with the operating conditions. The circuits therefore do not require the generation of an internal fixed bias reference. This leads to robust circuits that are independent of environmental factors.

One embodiment of the present invention is an apparatus for aligning an input signal that has a reference signal having a reference phase with a feedback signal having a feedback phase. A phase-frequency detector compares the reference phase with the feedback phase to generate a phase difference signal. The phase-frequency detector outputs the phase difference signal to a charge pump. The charge pump uses the phase difference signal to output a charge pump output that has a substantially linear relationship with the phase difference signal. The charge pump output is filtered by a loop filter to produce a control voltage. The control voltage controls the voltage controlled delay element to produce an output signal that is phase aligned with the reference signal. A bias generator provides the proper bias for the circuit elements such that offset is substantially eliminated.

A PLL or DLL designed according to the present invention has a bandwidth that tracks the operating frequency through a ratio of capacitors. Because a designer is not overconstrained by independently varying process parameters, a designer can be very aggressive in setting bandwidth. This results in reduced jitter. The process independent ratio also frees a designer from having to design for low-end frequency operation. In fact, there is no theoretical minimum frequency of operation with the current invention.

Another feature of self-biasing provided by the current invention is high IC technology independence. That is, the current invention may be easily ported to a number of different IC technologies with virtually no change in the design.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the digit(s) to the left of the two rightmost digits in the corresponding reference number.

BRIEF DESCRIPTION OF THE FIGURES

The present invention will be described with reference to the accompanying drawings, wherein.

DETAILED DESCRIPTION OF THE PREFERRED EMBODIMENTS

The current invention is directed to a solution to the jitter and offset problems commonly encountered when implementing phase-locked loops (PLL) and delay-locked loops (DLL) in the high noise environments of high speed digital electronics. A PLL or DLL designed according to the present invention has reduced jitter and offset as compared to PLL or DLL circuits designed using conventional techniques.

The circuits used in the present invention have the following control relationship with respect to a delay through the circuit. The delay is inversely proportional to the control voltage of the circuit. Furthermore, the delay is inversely proportional to the square root of the bias current in the circuit.

Phase Locked Loop

Figure 1:
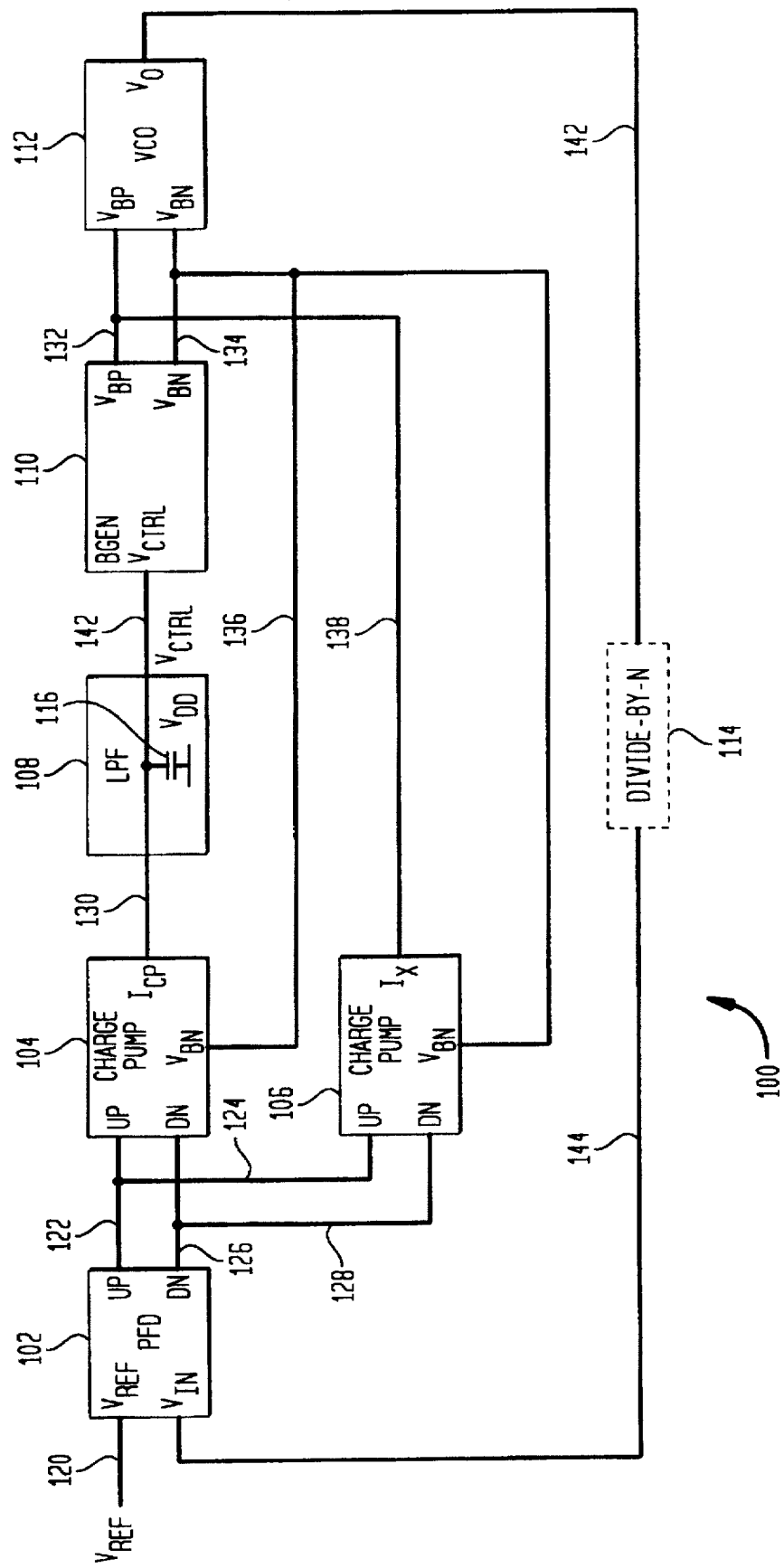
FIG. 1 is a phase-locked loop (PLL) designed according to the present invention.

FIG. 1 illustrates a PLL 100 designed according to a preferred embodiment of the present invention. PLL 100 comprises a phase-frequency detector 102, charge pumps 104,106, loop filter 108, bias generator 110, voltage controlled element 112, and an optional divide-by-N circuit 114.

Phase-frequency detector 102 has two inputs $V_{REF}$ and $V_{IN}$ and two outputs, UP and DN. In FIG. 1, a phase-frequency detector 102 (PFD) compares the phase of a first input signal, $V_{REF}$, on line 120 with the phase of a second input signal $V_{IN}$ on line 144. The output of PFD 102 is a pulse having a width substantially equal to the amount by which $V_{REF}$ leads or lags $V_{IN}$. If $V_{REF}$ leads $V_{IN}$, the pulse appears on the UP output of PFD 102 on line 122. If $V_{REF}$ lags $V_{IN}$, the pulse appears at the DN output on line 126. The UP and DN outputs of PFD 102 are input to charge pumps 104,106 (described below)

Figure 5:
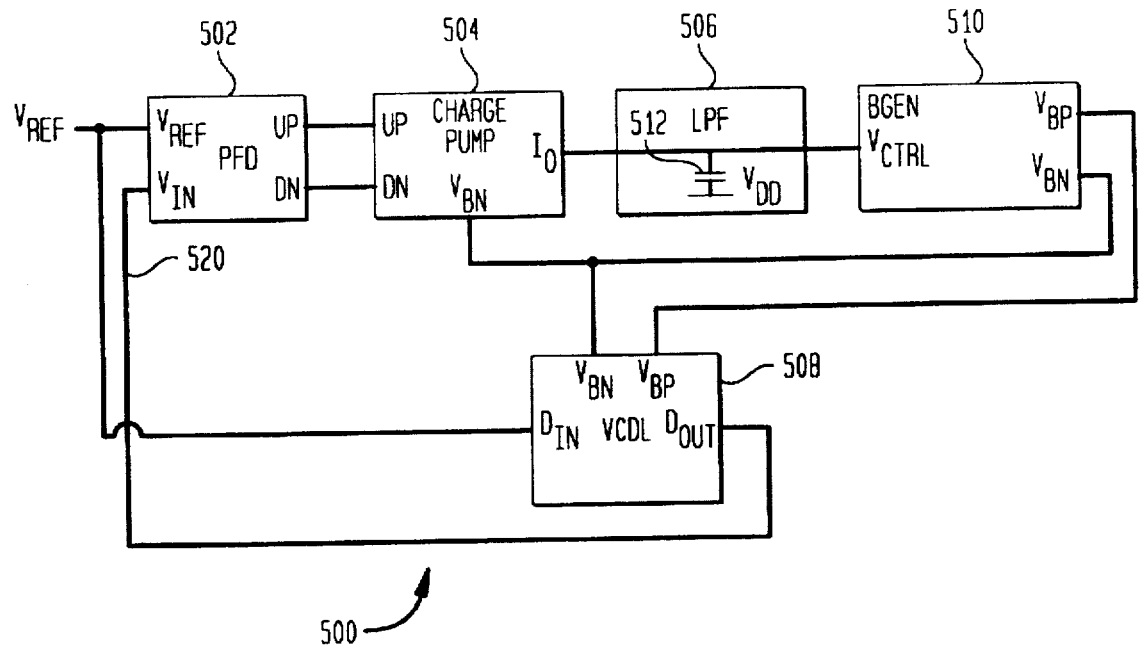
FIG. 5 illustrates a delay-locked loop (DLL) designed according to a preferred embodiment of the present invention.

A conventional phase-frequency detector is shown in FIG. 5 in Ian A. Young, et al., *A PLL Clock Generator with 5 to 110 MHZ of Lock Range for Microprocessors*, VOL. 27, NO. 12, IEEE JOURNAL OF SOLID-STATE CIRCUITS, 1599, 1601 (November 1992). The reference is hereby incorporated by reference in its entirety. A conventional PFD can be used as PFD 102 with the circuits of the present invention. However, for reasons explained below, the PFD 102 is a modified version of the referenced conventional PFD.

Figure 2:
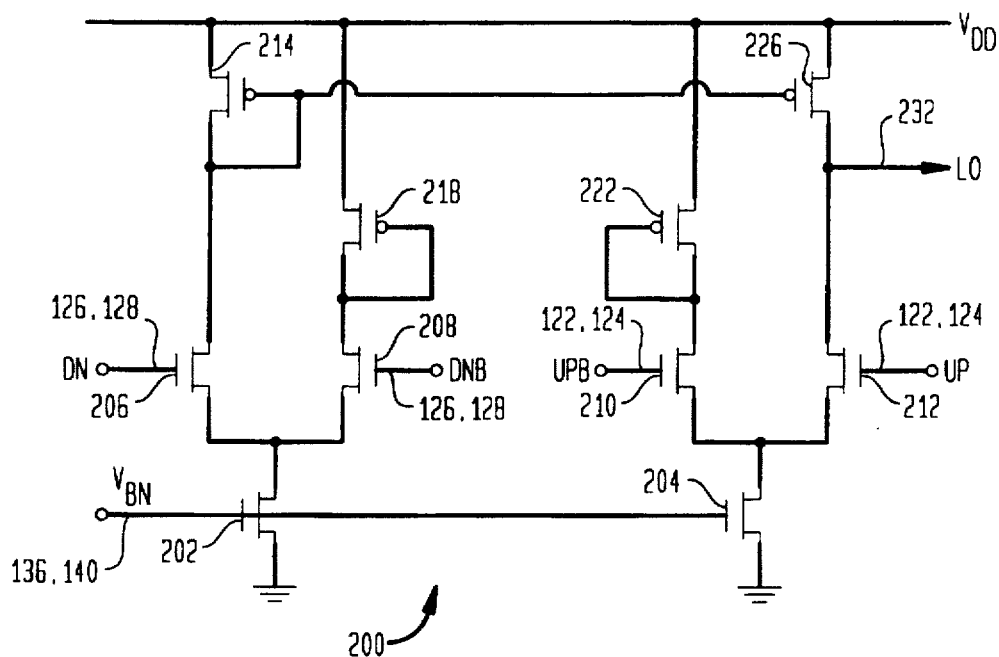
FIG. 2 illustrates a charge pump designed according to a preferred embodiment of the present invention.

The output of PFD 102 is input to charge pumps 104,106. Charge pumps 104,106 each have three inputs and one output. Each charge pump 104,106 has an UP input to produce a negative current pulse at the output, a DN input to produce a positive current pulse at the output, and a $V_{BN}$ input to bias a charge pump current source (see FIG. 2, items 202 and 204). The UP and DN inputs form a differential pair. Referring to FIG. 2, there is an UP input on transistor 212, and a corresponding inverted up input (UPB) on paired transistor 210. Similarly, there is a DN input on transistor 206, and a corresponding inverted DN input (DNB) on paired transistor 208. The output of charge pump 104 is a current $I_{CP}$ on line 130.

As discussed below, charge pump 106 acts as a resistor in PLL 100. Its output is a current which is added to a buffered version of $V_{CTRL}$, $V_{BP}$.

The UP output of PFD 102 is coupled to the UP input of charge pump 104 via line 122. The UP output of PFD 102 is coupled to the UP input of charge pump 106 via line 124. The DN output of PFD 102 is coupled to the DN input of charge pump 104 by line 126. The DN input of PFD 102 is coupled to the DN input of charge pump 106 by line 128.

The charge pump 104,106 converts its input, either the UP input or the DN input, into an analog current for subsequent processing in the PLL circuit. Floyd M. Gardner, *Charge-Pump Phase-Lock Loops*, Vol. COM-28, IEEE TRANSACTIONS ON COMMUNICATIONS, 1849 (November 1980) describes the general operation of a charge pump. The reference is hereby incorporated by reference in its entirety.

It should be noted that the charge pump used in the preferred embodiment of the present invention comprises a circuit having certain characteristics described above.

Each charge pump 104, 106 is biased by a bias voltage $V_{BN}$. $V_{BN}$ is generated by bias generator (BGEN) 110 (described below). The output of charge pump 104 is input to a low pass filter (LPF) 108. The output of charge pump 106 is input to the $V_{BP}$ input of voltage controlled oscillator (VCO) 112.

A charge pump 200 having the above described control relationship necessary for the present invention is shown in FIG. 2. Charge pump 200 is an exemplary circuit for charge pumps 104,106. Bias input $V_{BN}$ provides sufficient bias such that transistors 202 and 204 act as current sources. According to the preferred embodiment of the present invention, charge pumps 104, 106 accept differential inputs denoted UP and UPB (UP Bar), DN (Down), and DNB (Down Bar). Inputs DN, DNB, UP, and UPB, if asserted, cause transistors, 206, 208, 210, and 212, respectively, to act as switches. The switching action allows current to pass from current sources 202 and 204.

Figure 2A:
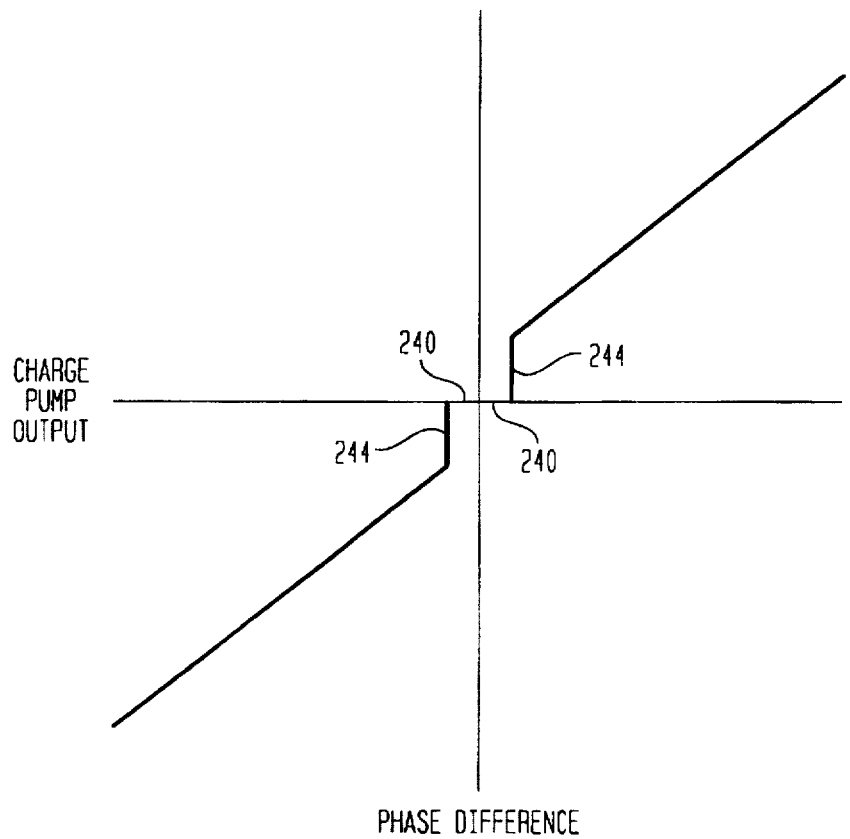
FIG. 2A illustrates the charge pump output as a function of phase difference curve of a conventional PLL or DLL.

The charge pump 200 ideally puts out no current when there is no phase difference, that is, when the PLL is in the locked condition. However phase offset may affect the operation of the PLL 100 to cause the PFD 102 to behave as if there is a phase difference present between its inputs. Referring to FIG. 2A, phase offset causes the illustrated curve to be shifted to the left or the right. The present invention provides the following method for removing the offset.

PMOS transistors 214 and 226 form a current mirror. As is well known, the current mirror mirrors current through transistor 214 in transistor 226. That is, transistor 226 sources a current substantially equivalent to a current sensed by transistor 214.

PMOS transistors 218 and 222 are diode coupled. They serve to match the loading provided by transistors 214 and 226 in the presence of UP or DN input pulses from PFD 102. With no UP or DN input pulses from PFD 102, all current from current sources 202 and 204 flows through transistors 218 and 222 respectively. As a result, the output of circuit 200 is in a high impedance state.

With equal UP and DN pulses for PFD 102, all current from sources 202 and 204 flows through transistors 214 and 226 respectively. $V_{BN}$ (generated by the BGEN 110 as described below) biases transistor 202. The bias causes transistor 202 to source sufficient current to produce a voltage at the drain of transistor 214. The produced voltage is substantially equal to $V_{CTRL}$. This voltage equality results because all transistor sizes in charge pump 200 are chosen to match the corresponding device sizes in BGEN 110. As a result, the gate voltage of transistor 214 is substantially equal to $V_{CTRL}$.

$V_{BN}$ also biases transistor 204. Due to the current mirror configuration, transistor 226 has a gate voltage substantially equal to $V_{CTRL}$. Such a gate voltage causes transistor 226 to source sufficient current to make the voltage at its drain, the output of charge pump 200, substantially equal to $V_{CTRL}$.

If there is no pulse on the UP and DN inputs, transistors 226 and 212 are off. Thus, the output of the circuit is in a high impedance state.

Thus, when the UP and DN inputs have substantially the same pulse on them, the output of the charge pump 200 is forced to $V_{CTRL}$. This is the state of the charge pump 200 when it is not connected to LPF 116 (i.e., disconnected). However, when the charge pump 200 is connected to the LPF 116, no current flows from the charge pump 200 (i.e., $I_{IC}=0$). This is because the LPF 116 defines $V_{CTRL}$. Therefore, the charge pump 200 outputs no net current, thereby compensating for any offset. This is a result of $V_{BN}$ being set to the value causing the charge pump 200 to output $V_{CTRL}$ when the charge pump 200 is disconnected by the BGEN 110.

A conventional PFD, such as referenced in Young et al. above, is limited in its ability to output short duration pulses. Short duration pulses result from small phase differences between the input and reference signals at the input of a conventional PFD. The limitation results in part due to the rise and fall times of the devices used to create the pulse representing phase difference. The limitation manifests itself as a deadband region (see deadband region 240 in FIG. 2A) in the operation of a conventional PFD. In the deadband region, no pulse is output even though a small phase difference may exists at the input. Thus, no current is output by charge pump 104. This deadband region results in an nonlinearity in the operation of a conventional PFD. The nonlinearity is undesirable because it can cause the PLL to jitter around the deadband region.

A second degradation of the linearity of the charge pump output in conventional PLL circuits arises due to the switching action of the circuits comprising the charge pump. The circuit switching action produces extra charge that causes an increase in gain for the charge pump output, $I_{IC}$. The increase in gain lasts for some small amount of phase difference (see overshoot 244 in FIG. 2A). After the small amount of phase difference the charge pump output settles down to a desired constant slope, that is, linear operation.

Figure 2B:
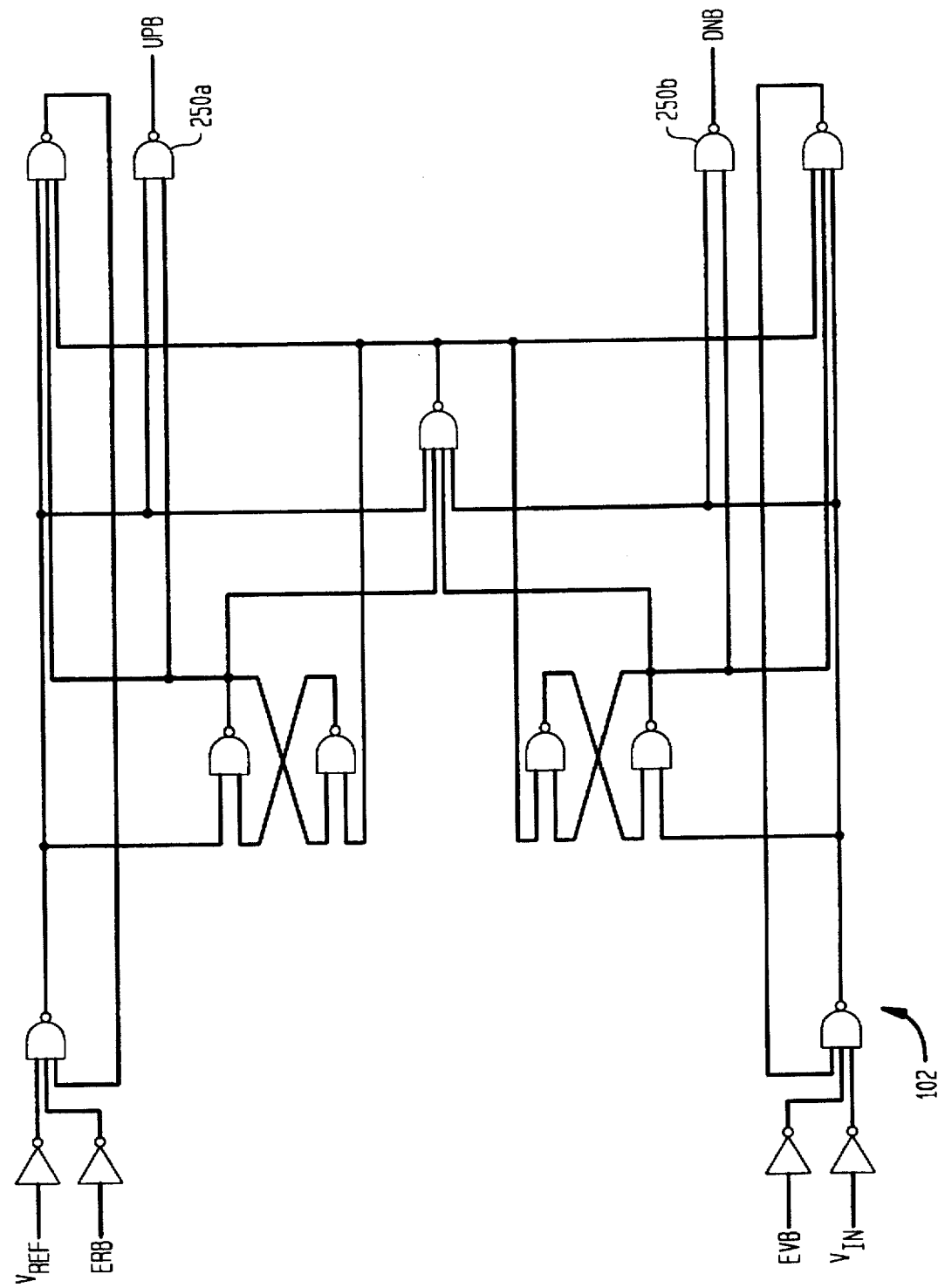
FIG. 2B illustrates a phase-frequency detector according to a preferred embodiment of the present invention.

A PFD 102 for overcoming the aforementioned undesirable nonlinear characteristics of conventional PFDs is illustrated in FIG. 2B. The fundamental difference between the PFD 102 and a conventional PFD is the addition of the 2-input NAND gates 250a and 250b on the output. The addition of the NAND gates 250a and 250b causes no change in the maximum operating frequency of the PFD 102 compared with a conventional PFD. However, the PFD 102 produces a small UP pulse for every DN pulse and a small DN pulse for every UP pulse. The pulses are produced such that for in-phase inputs, two small equal duration pulses are produced at the UP and DN outputs. The charge pump 104 cancels the UP and DN inputs such that zero current is produced at its output. In the presence of a small phase difference, the UP and DN pulses are not equal. The difference between the UP and DN pulses is representative of the small phase difference between the $V_{REF}$ and $V_{IN}$ inputs. However, both the UP and DN pulses are of sufficient duration to allow the devices in the charge pump 104 to form a valid current output. The PFD 102, therefore, uses the subtractive nature of the UP and DN inputs in operation of the charge pump 104 to substantially eliminate the deadband region 240. In addition, the circuit is designed using a differential pair. Thus, any charge that is produced as a result of the operation of the phase detection is effectively canceled. As a result, the combination of the PFD 102 and the charge pump 104 has a substantially linear output charge as a function of input phase difference.

Referring back to FIG. 1, the $I_{IC}$ output of charge pump 104 passes via line 130 through a loop filter 108. The loop filter 108 is generally a low pass falter (LPF). In the ensuing discussion, loop filter 108 and LPF 108 are used interchangeably. In the preferred embodiment, LPF 108 comprises a capacitor 116. As shown in FIG. 1, one terminal of capacitor 116 is connected to supply voltage $V_{DD}$. The other terminal of capacitor 116 is connected to $V_{CTRL}$. Capacitor 116 of LPF 108 integrates $I_{CP}$ thereby generating control voltage, $V_{CTRL}$ on line 142. Thus, LPF 108 functions to integrate the $I_{CP}$ output from charge pump 104, to generate control voltage $V_{CTRL}$. LPF 108 also suppresses high frequency noise, thereby providing stability to the operation of PLL 100.

The filtered output of LPF 108 is input via line 142 to the $V_{CTRL}$ input of a bias generator (BGEN) 110. BGEN 110 has one input, $V_{CTRL}$ and generates two outputs $V_{BP}$ and $V_{BN}$. BGEN 110 converts $V_{CTRL}$ to the proper bias, $V_{BN}$, for controlling current sources in VCO 112 and charge pumps 104, 106. The proper bias for $V_{BN}$ is where the output of a half buffer stage, contained in BGEN 110, equals $V_{CTRL}$.

Applying $V_{BN}$ as the bias voltage to control current sources in VCO 112 and charge pumps 104, 106 in circuits having the control relationship discussed above, gives the present invention its self-biasing advantages over conventional PLL and DLL designs. Self-biasing is accomplished in the following manner. $V_{CTRL}$ is input to BGEN 110 to generate bias $V_{BN}$. Bias $V_{BN}$ in turn supplies the charge pump current used to generate $V_{CTRL}$. BGEN 110 output $V_{BN}$ biases current sources 202, 204 in charge pumps 104,106 and VCO 112. BGEN 110 also generates $V_{BP}$. $V_{BP}$ is a buffered version of, and nominally equal to, $V_{CTRL}$. $V_{BP}$, therefore, isolates $V_{CTRL}$ from the operation and distribution loads of VCO 112. BGEN 110 output $V_{BP}$ is input to VCO 112. Because all biases are generated without using fixed internal bias sources, the circuit is self-biasing.

Figure 3:
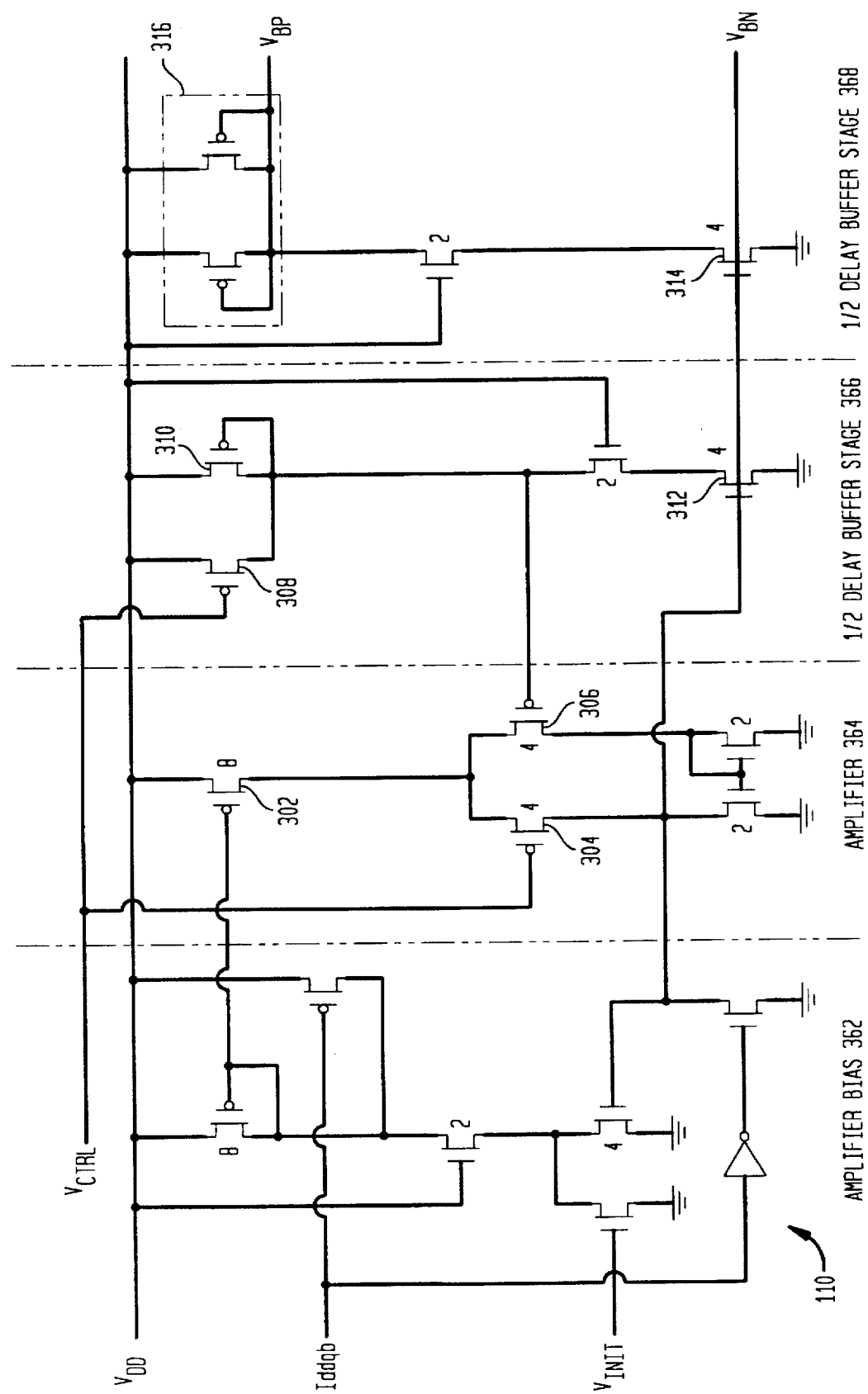
FIG. 3 illustrates a bias generator circuit designed according to a preferred embodiment of the present invention.

An example implementation of a BGEN 110 used to generate the appropriate bias signals according to a preferred embodiment of the present invention is illustrated in FIG. 3. Referring to FIG. 3, BGEN 110 comprises 4 stages: an amplifier bias stage 362, an amplifier stage 364, and two halves of a delay-buffer stage 366,368. The amplifier bias stage 362 generates signals to appropriately bias the amplifier stage components. The amplifier stage 364 comprises transistors 302, 304, and 306.

The amplifier stage 364 is set up in a negative feedback configuration. As a result, the amplifier stage 364 attempts to equate the voltages appearing at the gates of transistors 304 and 306. The voltage at the gate of transistor 304 is $V_{CTRL}$. Thus, the amplifier stage 364 attempts to make the voltage at the gate of transistor 306 equal to $V_{CTRL}$.

The voltage at the gate of transistor 306 is the output of the half delay buffer stage 366. The output of the half delay buffer stage 366 is generated by the current source transistor 312. The symmetric load acts as a variable resistance that varies linearly as $V_{CTRL}$ varies. Thus, the amplifier adjusts transistor 312 until it sources sufficient current to cause the voltage at the gates of transistors 304 and 306 to be equal. The output of transistor 304 is the proper bias value for $V_{BN}$. As described above, the proper bias for $V_{BN}$ is where the output of the half delay buffer stage 366 equals $V_{CTRL}$.

The output of the amplifier biases the current source transistor 314 in the second half delay buffer stage 368. The second delay buffer stage 368 has a symmetric load element 316 similar to the symmetric load element formed by transistors 308 and 310. In this case however, the symmetric load element 316 is controlled by the current source 314 which has been biased by $V_{BN}$. As a result, the second half delay buffer stage outputs a voltage nominally equal to $V_{CTRL}$. This voltage is denominated $V_{BP}$.

$V_{BN}$ also biases current source 202 of charge pump 200. The bias, $V_{BN}$, causes a voltage equal to $V_{CTRL}$ to exist on the gate of transistor 226. This arises by operation of the current mirror described above. This, in turn, gives rise to a voltage of $V_{CTRL}$ at the disconnected charge pump output with UP and DN high. Thus, no phase offset will exist between PLL 100 and inputs $V_{REF}$ and $V_{IN}$. In other words, with UP and DN high, all gate and drain voltages of PMOS transistors 214, 226, 308, and 310 equal $V_{CTRL}$. Because the circuit does not use any internally generated fixed bias sources, the circuits are self-biasing. The result is that there is no input phase offset for all values of $V_{CTRL}$ and correspondingly all operating frequencies.

Voltage Controlled Oscillator (VCO) 112 has two inputs and one output. Input $V_{BP}$ is a buffered version of control voltage $V_{CTRL}$. An example of a VCO circuit is shown in FIG. 3 of John G. Maneatis and Mark A. Horowitz, *Precise Delay Generation Using Coupled Oscillators*, VOL. 28, No. 12, IEEE JOURNAL OF SOLID STATE CIRCUITS, 1273, 1274 (December 1993) (hereafter Maneatis and Horowitz). Input $V_{BP}$ controls the frequency of VCO 112 by controlling the symmetric load resistance in the VCO 112 delay circuitry. In this manner, PLL 100 is phase-locked to its input $V_{REF}$. The output of VCO 112, $V_O$, is the phase-locked output signal. The output signal has a frequency which is phase-locked to the frequency of $V_{REF}$, the input to PLL 100.

Figure 4:
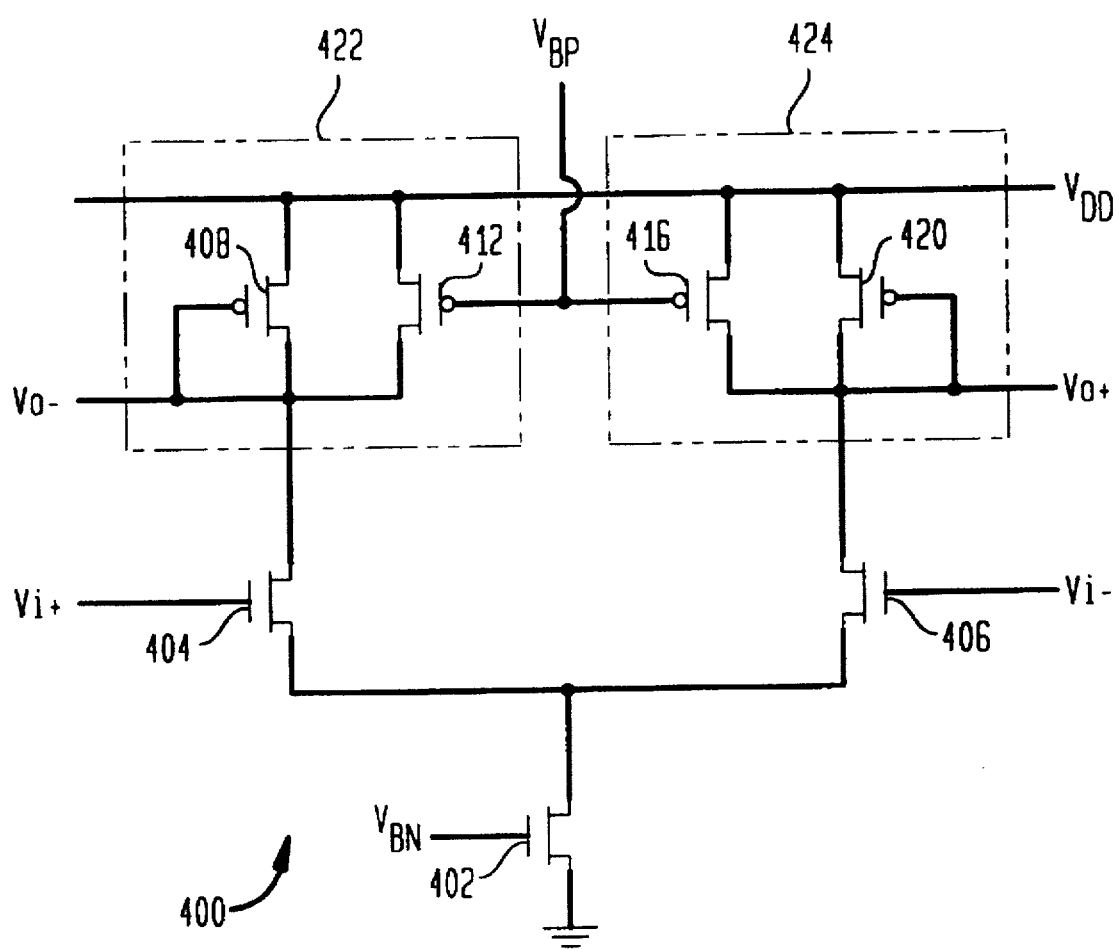
FIG. 4 illustrates a delay buffer stage designed according to a preferred embodiment of the present invention.

VCO 112 comprises three or more delay-buffer stages. A delay-buffer stage 400 according to a preferred embodiment of the present invention is shown in FIG. 4. In FIG. 4, transistor 402 is biased by PLL 100 bias, $V_{BN}$. Transistors 408 and 412 form a symmetric load 422. The symmetric load 422 functions as a variable resistor network. The symmetric load 422 outputs a current as a function of its output voltage that varies symmetrically about the voltage $V_{CTRL}/2$. Transistors 416 and 420 form a second symmetric load 424. The symmetric load 424 also functions as a variable resistor network that outputs a current as a function of its output voltage that varies symmetrically about the voltage $V_{CTRL}/2$. The operation of delay-buffer stage 400 is described in more detail in Maneatis and Horowitz at page 1277–78.

As would be apparent to one of ordinary skill in the art, as $V_{BP}$ changes (i.e., as $V_{CTRL}$ changes in response to phase tracking) the resistivity of the variable resistor networks also change. This change directly controls the frequency of the output voltage, $V_O$, by changing the delay of the signal through delay-buffer circuit 400. A key point to remember is that $V_{CTRL}$ generates $V_{BN}$ through the current source bias circuit BGEN 110, and $V_{BN}$ subsequently controls $V_{CTRL}$ through the charge pump. By so doing, the circuit assumes its self-biasing characteristic since $V_{BN}$ is used to generate $V_{CTRL}$.

According to the preferred embodiment of the present invention, the output of VCO 112, $V_O$, is input to divide-by-N circuit 114. Divide-by-N circuit 114 causes VCO 112 to operate at a frequency N times that of $V_{REF}$. Divide-by-N circuit 114 is optional. Accordingly, in an alternative embodiment of the present invention, the output of VCO 112, $V_O$, may be input directly to the $V_{IN}$ input of PFD 102.

A mathematical description of PLL 100 follows. The PLL 100 may be modeled as a second order system. As such its transfer function can be described by the following characteristic equation:

$$\frac{1+2\zeta\left(\frac{s}{\omega_n}\right)}{\left(\frac{s}{\omega_n}\right)^2+2\zeta\left(\frac{s}{\omega_n}\right)+1}$$

where, $\zeta$ is the damping factor, and $\omega_n$ is the natural frequency or bandwidth of the system. PLL 100 is completely characterized by loop parameters $\zeta$ and $\omega_n$. As is shown below, the second order model of PLL 100 is defined by charge pump 104 current, $I_0$, VCO 112 gain $K_v$, capacitance C of capacitor 116, and a resistor having a resistance R. According to a preferred embodiment of the present invention, the resistor is caused by the charge pump 106 having an equivalent resistance equal to R. If only charge pump 104 were included in PLL 100, thereby requiring LPF to include a resistor (not shown) between capacitor 116 and $V_{CTRL}$ line 130, it can be shown that:

$$\zeta=\frac{1}{2}\sqrt{I_0 K_v R^2 C}, \quad \omega_n=\frac{2\zeta}{RC}$$

where:

$\omega_n$ is the natural frequency of the PLL 100 (rad/s), $\zeta$ is the damping factor of PLL 100, $I_0$ is the amount of current that the charge pump 200 is capable of sourcing or sinking (Amps), $K_v$ is the gain of VCO 112 (Hz/v), R is the value of the required resistor (Ohms), and C is the value of capacitor 116 (Farads).

The current through the one-half delay buffer stage in the bias generator is given by:

$$I_{BUFF}=\frac{k}{2}(V_{CTRL}-V_T)^2$$

where, $V_T$ is the threshold voltage of PMOS transistors (volts), and k is a constant of proportionality (amps/volts$^2$) for two PMOS transistors.

Using this equation, we can define a transconductance, $g_m$, as:

$$g_m=\frac{dI_{BUFF}}{dV_{CTRL}}=k(V_{CTRL}-V_T)=\sqrt{2kI_{BUFF}}$$

The output resistance of the diode connected symmetric load in the half-buffer replica is $1/g_m$.

In a conventional PLL design with a resistor in series with the LPF 116 (capacitor), a pulse from the charge pump 104 causes an immediate change in $V_{CTRL}$ of $I_0 R$. According to the preferred embodiment of the present invention, the resistor (not shown) of a conventional PLL is replaced by charge pump 106. Charge pump 106 produces a charge that is nominally equal to that produced by charge pump 104 or some fixed ratio thereof. $I_x$ is the current charge pump 106 is capable of sourcing or sinking. A pulse from charge pump 106 will cause an immediate change in the buffered control voltage, $V_{BP}$, of $I_x/g_m$.

Equating the change in $V_{CTRL}$ for charge pump 104 with the change in $V_{BP}$ from charge pump 106, yields:

$$I_0=\frac{I_x}{g_m}.$$

Therefore charge pump 106 has an equivalent resistance given by:

$$R=\frac{I_x}{I_0}\frac{1}{g_m}=\frac{I_x}{I_0}\frac{1}{\sqrt{2kI_{BUFF}}}.$$

A circuit designed according to Maneatis and Horowitz at 1277 (FIG. 7) has a delay, $\tau=R_{eff}C_{eff}$. The resistance of interest for the symmetric load, described above, is at the ends of the voltage swing where the current through the symmetric load, I, is:

$$I=\frac{k}{2}\left[(V_{CTRL}-V_T)V-\frac{V^2}{2}\right]$$

from which, $$\frac{dI}{dV}=\frac{k}{2}(V_{CTRL}-V_T)$$

Thus, $$R_{eff}=\frac{2}{k(V_{CTRL}-V_T)}$$

$C_{eff}$ is simply the load capacitance of the delay stage $C_L$.

Thus, stage delay, $\tau$, is given by:

$$\tau=R_{eff}C_{eff}=\frac{2C_L}{k(V_{CTRL}-V_T)}$$

The frequency of the output of VCO 112 is related to the delay through n stages by:

$$F=\frac{1}{2n\tau}=\frac{k(V_{CTRL}-V_T)}{4nC_L}=\frac{\sqrt{2kI_{BUFF}}}{4nC_L}$$

VCO 112 gain, $K_v$, is defined as:

$$K_v=\frac{dF}{dV_{CTRL}}=\frac{k}{4nC_L}$$

Substituting the derived quantities into the equations for $\zeta$ and $\omega_n$ yields:

$$\zeta=\frac{1}{2}\sqrt{I_0 K_v R^2 C}=$$

$$\frac{1}{2}\sqrt{I_0}\sqrt{\frac{k}{4nC_L}}\frac{I_x}{I_0}\frac{1}{\sqrt{2kI_{BUFF}}}\sqrt{C}=$$

$$\frac{1}{4}\frac{I_x}{\sqrt{I_0 I_{BUFF}}}\sqrt{\frac{C}{2nC_L}}$$

and $$\omega_n=\frac{2\zeta}{RC}=\frac{1}{2}\frac{I_x}{\sqrt{I_0 I_{BUFF}}}\sqrt{\frac{C}{2nC_L}}\frac{I_0}{I_x}\frac{\sqrt{2kI_{BUFF}}}{C}=$$

-continued $$\frac{1}{2}\sqrt{kI_0}\frac{1}{\sqrt{nC_LC}}$$

Dividing the bandwidth, $\omega_n$, by the operating frequency $\omega=2\pi F$ results in:

$$\frac{\omega_n}{\omega} =$$

$$\frac{\omega_n}{2\pi F} = \frac{1}{4\pi}\sqrt{kI_0}\frac{1}{\sqrt{nC_LC}}\frac{4nC_L}{\sqrt{2kI_{BUFF}}} =$$

$$\frac{1}{2\pi}\sqrt{\frac{I_0}{I_{BUFF}}}\sqrt{\frac{2nC_L}{C}}$$

Because charge pumps 104 and 106 are self-biased, the buffer bias current is related to $I_0$ and $I_x$ by, $I_0 = y*I_{BUFF}$, and $I_x = x*I_{BUFF}$, where x and y are fixed current ratios. Thus, $$\zeta = \frac{1}{4}\frac{x}{\sqrt{y}}\sqrt{\frac{C}{2nC_L}}, \frac{\omega_n}{\omega} = \frac{1}{2\pi}\sqrt{y}\sqrt{\frac{2nC_L}{C}}$$

For divide factors, N, other than 1:

$$\zeta = \frac{x}{4\sqrt{2ynN}}\sqrt{\frac{C}{C_L}}, \frac{\omega_n}{\omega} = \frac{\sqrt{2ynN}}{2\pi}\sqrt{\frac{C_L}{C}}$$

Thus, $\zeta$ and $\omega_n/\omega$ are determined by constants and the ratio of two capacitances. They are therefore constant and independent of process parameters and operating frequency.

In the preferred embodiment of the present invention, x=y=1. That is, charge pump 104 current, $I_0$, is substantially equal to charge pump 106, $I_x$. Substituting into the above equations for $\zeta$ and $\omega_n/\omega$ with N=1 yields:

$$\zeta = \frac{1}{4\sqrt{2n}}\sqrt{\frac{C}{C_L}}, \frac{\omega_n}{\omega} = \frac{\sqrt{2n}}{2\pi}\sqrt{\frac{C_L}{C}}$$

Again, note the independence of $\zeta$ and $\omega_n/\omega$ from process parameters and operating frequency.

Delay-Locked Loop

FIG. 5 illustrates a delay locked loop (DLL) 500 according to a preferred embodiment of the present invention. The circuit and self-biasing of the DLL 500 is similar to that of the PLL 100.

Referring to FIG. 5, the DLL 500 comprises a phase-frequency detector 502, a charge pump 504, a low pass filter (LPF) 506, a bias generator circuit (BGEN) 510, and a voltage controlled delay line (VCDL) 508. The phase frequency detector 502, charge pump 504, LPF 506, and BGEN 510 operate substantially as described above. The function of the VCDL 508 is to add a variable amount of delay to its input $D_{IN}$. The VCDL 508 adds or subtracts sufficient delay to make the phase of its output, $D_{OUT}$, match the phase of $D_{IN}$.

As with the PLL 100, the DLL 500 includes circuits having the aforementioned control relationship. By using circuits having the forgoing characteristics, the advantages to the invention are realized. The following derivation describes the advantages mathematically.

First assume, that the DLL 500 is operated in an open-loop condition. That is assume that line 520 is broken between $V_{IN}$ and $D_{OUT}$ such that there is no feedback. The delay change, $D_{OUT}$, can be shown to be:

$$D_{OUT} = K_{DL}\left(\frac{D_{IN}}{T_{REF}} \cdot I_{CH}\right)\frac{1}{sC} \quad \text{(Open Loop)}$$

where:

$D_{IN}$ is the phase of $V_{REF}$, $D_{OUT}$ is the delay change required to bring $V_{REF}$ in phase with $V_{IN}$, $I_{CH}$ is the amount of current that charge pump 504 is capable of sourcing or sinking, $T_{REF}$ is the period of the reference input, $K_{DL}$ is the gain of the delay line in units of seconds/volt, and C is the value of capacitor 512 included in the LPF 506.

Thus, the open loop gain, A, defined as $D_{OUT}/D_{IN}$ is:

$$A = \frac{D_{OUT}}{D_{IN}} = \frac{I_{CH}K_{DL}F_{REF}}{sC}$$

Now assume that break in line 520 is closed, leading to closed loop operation of the DLL 500. For the closed loop case:

$$D_{OUT} = A(D_{IN} - D_{OUT}).$$

From this equation, the closed loop gain $D_{OUT}/D_{IN}$ is:

$$\frac{D_{OUT}}{D_{IN}} = \frac{A}{1+A} = \frac{1}{1+A^{-1}} = \frac{1}{1+\frac{s}{P_1}}$$

where:

$$P_1 = \frac{I_{CH}}{C}K_{DL}F_{REF} = 2\pi F_0.$$

Thus, $$F_0 = \frac{I_{CH}K_{DL}F_{REF}}{2\pi C}$$

The above equation represent the loop bandwidth of DLL 500 as a function of operating frequency $F_{REF}$. From equation for the loop bandwidth, the ratio of the loop bandwidth to operating frequency is given as:

$$\frac{F_0}{F_{REF}} = \frac{I_{CH}K_{DL}}{2\pi C}$$

The delay of a delay stage in the VCDL 508 is given by time constant $R_{eff}C_{eff}$ where $R_{eff}$ is the effective resistance of the delay stage and $C_{eff}$ is the capacitance of the delay stage. Correspondingly, for n delay stages, the delay is n $R_{eff}C_{eff}$.

To determine $R_{eff}$, consider the current through a symmetric delay. For a symmetric load (described above):

$$I = \frac{k}{2}\left[(V_{CTRL} - V_T)V - \frac{V^2}{2}\right].$$

Thus, at the ends, where V is approximately 0, $$\frac{dI}{dV} = \frac{k}{2}(V_{CTRL} - V_T) = \frac{1}{R_{eff}}.$$

$C_{eff} = C_L \cdot C_L$ is the load capacitance of the delay stage. Thus, the delay for n delay stages in the VCDL 508 is given by:

$$nR_{eff}C_{eff} = \frac{2nC_L}{k(V_{CTRL} - V_T)}$$

The gain of the delay element, $K_{DL}$ is given by the derivative of the delay with respect to $V_{CTRL}$. Thus, $$K_{DL} = \frac{d\,Delay(V_{CTRL})}{dV_{CTRL}} = \frac{2nC_L}{k(V_{CTRL} - V_T)^2}$$

It can also be shown that the charge pump current, $$I_{CH} = y I_{BUFF} = y \frac{k}{2}(V_{CTRL} - V_T)^2$$

where y is the ratio of the charge pump current to the buffer bias current. Finally the ratio of the operating frequency to the reference frequency is given by $$\frac{F_0}{F_{REF}} = \frac{1}{2\pi} ny \frac{C_L}{C} = \frac{ny}{2\pi} \frac{C_L}{C}$$

Thus, $F_0/F_{REF}$ is determined by a constant and the ratio of two gate oxide capacitors. Furthermore, it is independent of transistor parameters.

The foregoing derivation illustrates that the bandwidth tracks the operating frequency as a function of a ratio of two capacitors. Furthermore, the function is independent of process parameters. Thus, the designer is not constrained to setting the bandwidth conservatively below the theoretical one tenth of the lowest operating frequency. The designer need only set $F_0/F_{REF}$ to one tenth.

Figure 6:
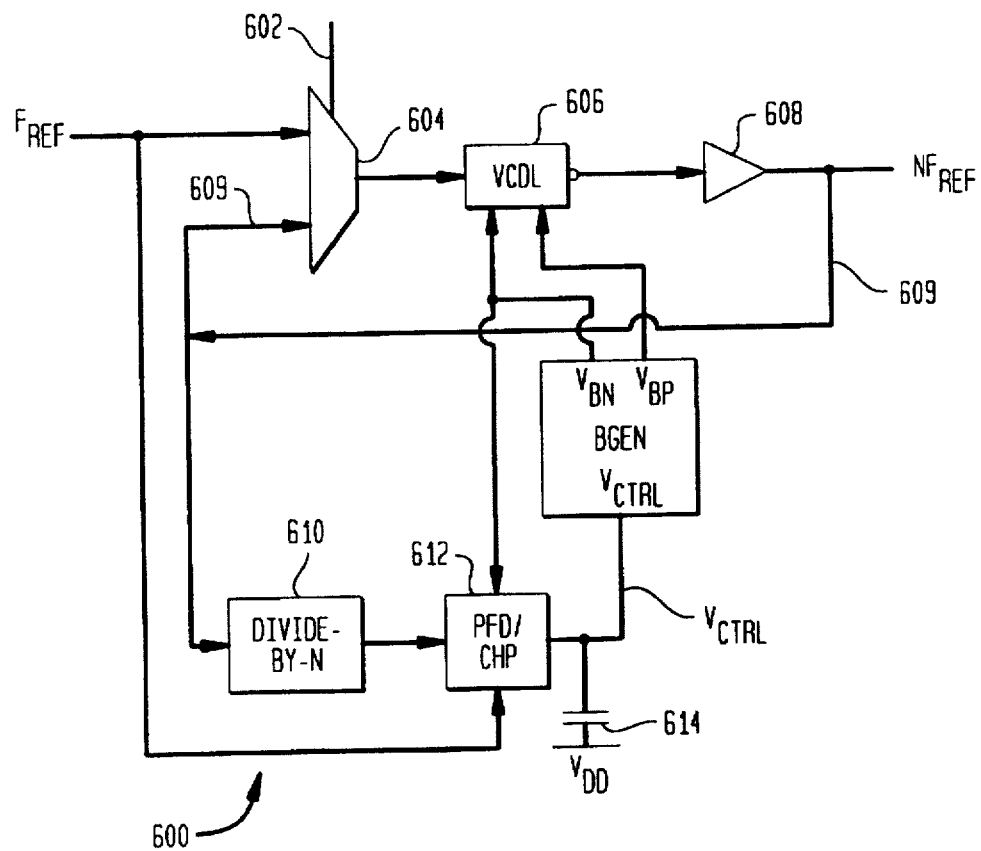
FIG. 6 illustrates the circuit topology of a recirculating delay-locked loop.

The circuits described above can be applied to any PLL or DLL block level organization, including the PLL 100 and the DLL 500. For example, the circuits can be used in the DLL 600 illustrated in FIG. 6. The DLL 600 outputs a signal having a frequency that is N times the reference frequency. The DLL 600 also accounts for clock distribution buffer delays using buffer 608 (described below). Referring to FIG. 6, a reference frequency, $F_{REF}$ is input to a multiplexer 604. $F_{REF}$ is also input to a PFD/CHP circuit 612. The PFD/CHP circuit 612 performs the functions of the phase-frequency detector 502 and charge pump 504 described above. As would be apparent to one of ordinary skill in the art, the functionality of PFD/CHP 612 may be performed by separate circuit elements. The output of the multiplexer 604 is input to one input of VCDL 606. A second input to the VCDL 606 is the filtered output of the PFD/CHP circuit 612. The output of the VCDL 606 is input to a clock distribution buffer 608. The output of the clock distribution buffer 608 is distributed throughout a system (not shown) requiring a synchronized clock. The output of the clock distribution buffer 608 is also distributed to a divide-by-N circuit 610. The divide-by-N circuit feeds one input of the PFD/CHP circuit 612. Capacitor 614 acts as a DLL 600 loop filter. The multiplexer 604 is controlled by a multiplexer control input 602. The purpose of the multiplexer is to choose between the clock edges of $F_{REF}$ and the output of the VCDL 606, which is a frequency multiplied version of $F_{REF}$ as input to the VCDL 606.

The DLL 600 of FIG. 6 operates in the following manner. The multiplexer first allows the reference frequency, $F_{REF}$ to pass through to the VCDL 606. Then the multiplexer control input 602 switches the state of the multiplexer such that a feedback signal 609 is switched into the VCDL 606. The multiplexer control input 602 maintains the multiplexer in the "feedback" state for a number of cycles. During this "feedback" state, the inverse of feedback signal 609 is repeatedly passed through the loop comprising the multiplexer 604, the VCDL 606, and the clock distribution circuit 608. The feedback signal 609 has a phase locked to N times $F_{REF}$. The multiplexer control input 602 will switch the multiplexer back to the original state upon the next occurrence of a clock pulse $F_{REF}$. The process then repeats.

There are at least two problems associated with operating a DLL in the manner illustrated in FIG. 6. The first arises because the last edge travels the loop comprising the multiplexer 604, the VCDL 606, and the clock distribution circuit 608 two times N times. The last clock edge will likely experience jitter as it travels through the clock distribution buffer 608 because the clock distribution buffer 608 is not controlled. The second problem is that the total delay of the multiplexer 604, the VCDL 606, and the clock distribution buffer 608 has to fit in a half cycle of $F_{REF}$. Due to the high frequencies involved, this is very difficult.

Figure 6A:
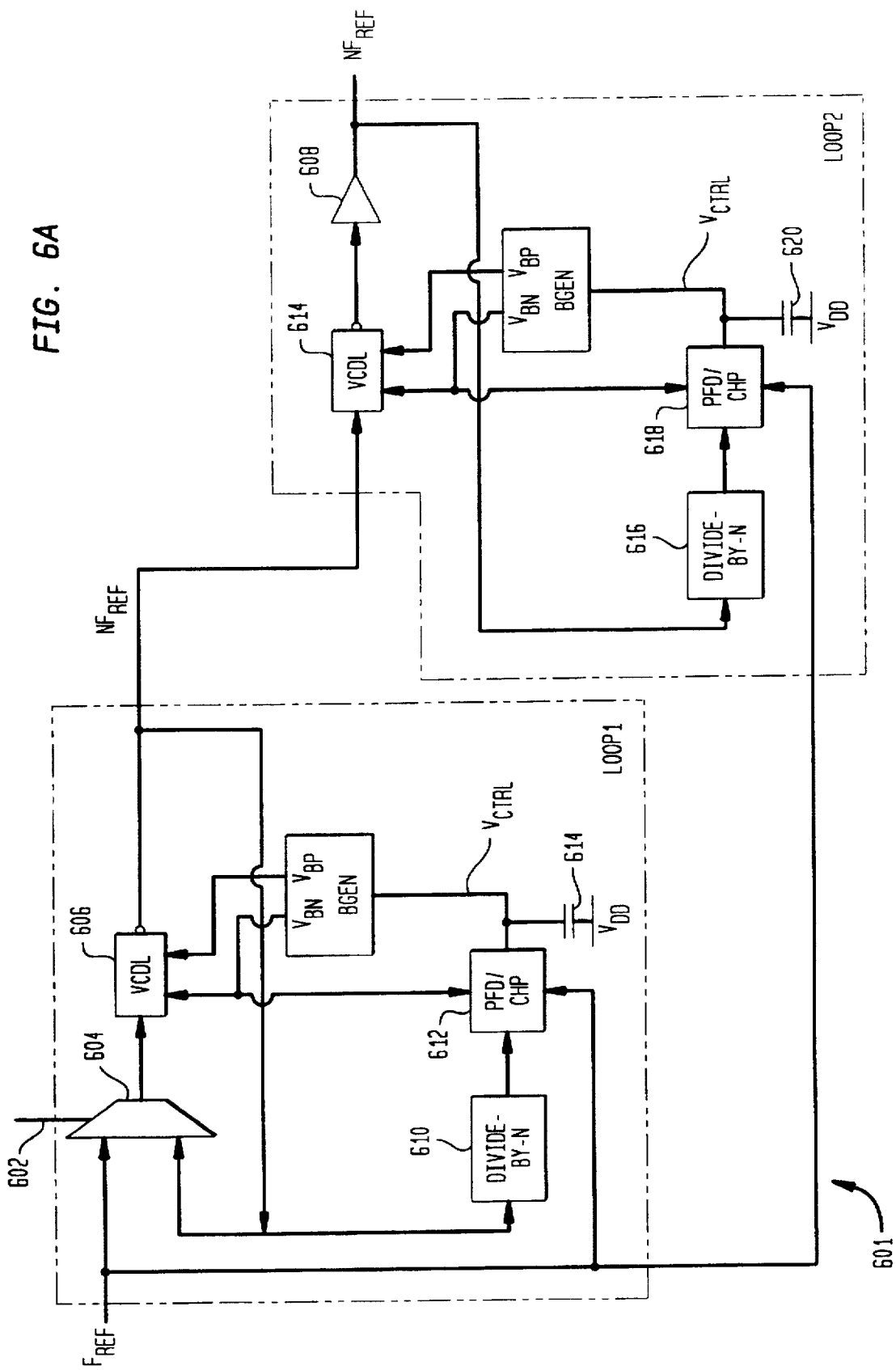
FIG. 6A illustrates the two loop circuit topology of delay-locked loop designed according to a preferred embodiment of the present invention.

To overcome the aforementioned problems, the single loop design DLL 600 was split into two loops. FIG. 6A illustrates the resulting design as DLL 601. The first loop, designated LOOP1, comprises the multiplexer 604, the VCDL 606, the divide-by-N circuit 610, the PFD/CHP circuit 612, and the loop filter 614. The second loop, designated LOOP2, comprises a second VCDL 614, a second divide-by-N circuit 616, a second PFD/CHP circuit 618, and a second loop filter 620. It would be apparent to one of ordinary skill in the art that the second divide-by-N circuit 616 need not be separate and distinct from the first divide-by-N circuit 610. The information needed from the second divide-by-N circuit can be obtained from the first divide-by-N circuit.

In the circuit illustrated in FIG. 6A, LOOP1 outputs a signal having a frequency substantially equal to N times the frequency of $F_{REF}$. However, the phase of the output of LOOP1 is not well defined. In order to make the phase substantially equal to the phase of $F_{REF}$, a second DLL, LOOP2, is used. Thus, the output of LOOP1 is input as one input to VCDL 614 of LOOP2. The output of the VCDL 614 is input to the divide-by-N circuit 616. The output of the divide-by-N circuit 616 is one input to the PFD/CHP circuit 618. The other input to PFD/CHP 618 is $F_{REF}$. In this manner, the phase of the output of DLL 601 is made substantially equal to the phase of $F_{REF}$. Furthermore, the frequency of the output of DLL 601 is a multiple, N, of the frequency of $F_{REF}$.

Jitter can be reduced in LOOP1 by designing the circuit using differential elements. Furthermore, jitter is reduced because the clock distribution buffer 608, which can be very noise sensitive, is not in LOOP1.

Not only is jitter reduced, but the half cycle delay limitation is eliminated. This is because LOOP1 only experiences delays due to the VCDL 606 and the MUX 604. These delays are generally short in comparison with the duration of a half cycle of $F_{REF}$. LOOP2 has no half cycle delay budget for clock distribution. As a result, the highest operating frequency of the DLL 601 is significantly higher than that of the DLL 600.

LOOP1 only uses rising edges in $F_{REF}$ to produce an output signal. As a result, the DLL 601 also performs duty cycle correction to 50%.

Operating Environment

Figure 7:
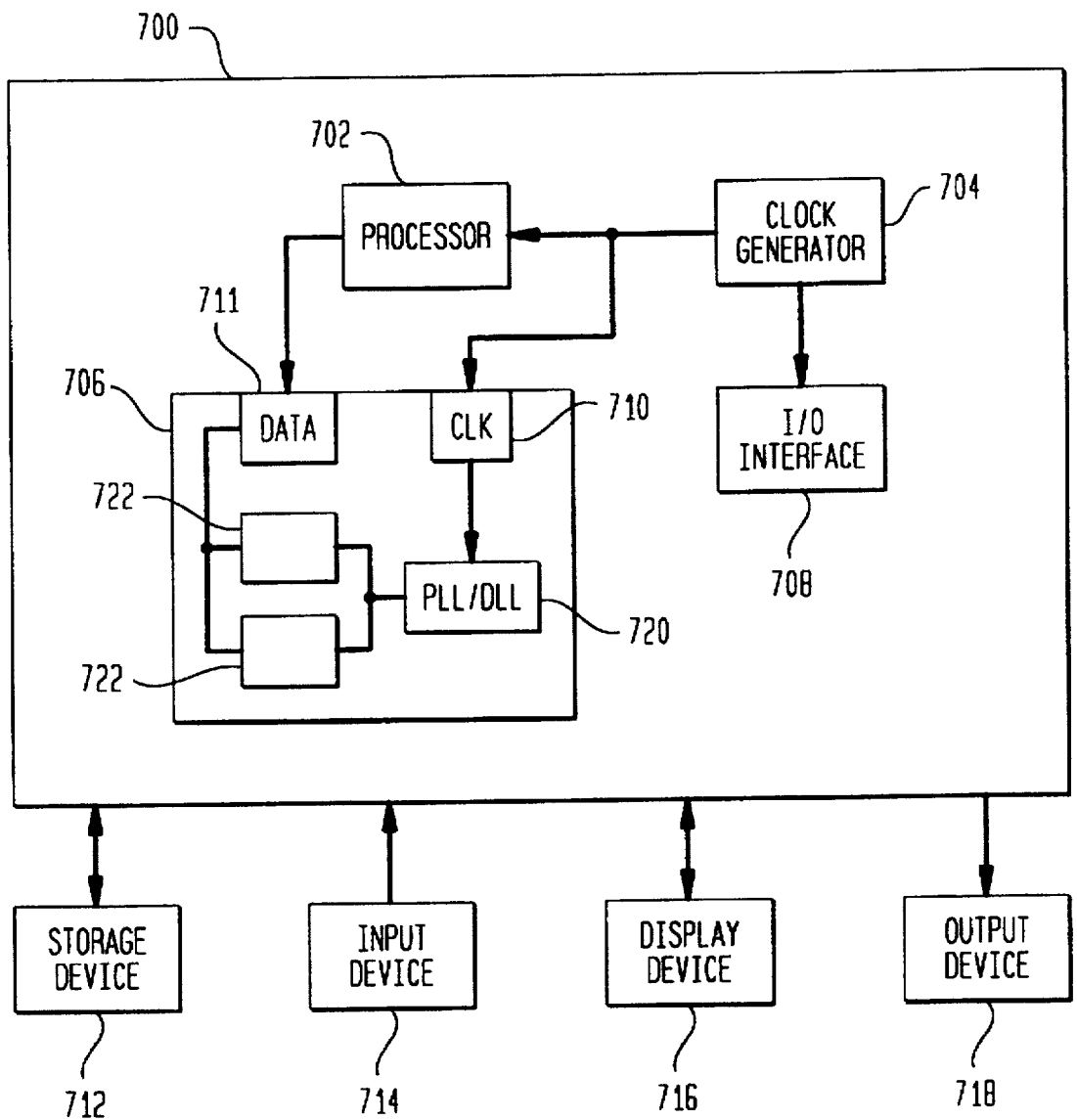
FIG. 7 illustrates a computer system which incorporates the present invention to provide clock synchronization.

An example of a system employing the preferred embodiment of the present invention is illustrated by the computer system of FIG. 7. Referring to FIG. 7, computer system 700 comprises a processor 702, a clock generator 704, an internal memory 706, and an I/O interface 708. Computer system 700 further comprises a storage device 712, an input device 714, a display device 716, and an output device 718. The function of the processor 702, the clock generator 704, the internal memory 706, the I/O interface 708, the storage device 712, the input device 714, the display device 716, and the output device 718 are well known in the art.

The clock generator 704 generates a clock signal and distributes it to the remainder of the computer system 700. It would be apparent to one of ordinary skill in the art that the clock generator 704 can be implemented in a number of ways including as part of the processor 702. A clock receiver circuit 710 receives the clock signal generated by the clock generator 704. A data receiver 711 receives data from the processor 702. The clock signal received by the clock receiver circuit 710 is input to a DLL or PLL (DLL/PLL) 720 according to the preferred embodiment of the present invention. The DLL/PLL 720 distributes the clock to a data receiver 711 and other internal memory elements 722, thereby distributing a synchronized clock to the various elements of internal memory 706.

FIG. 7 demonstrates the ability of the present invention to synchronize clock signals in a computer system. It should be noted that the present invention may be implemented in any system requiring distribution of a synchronization clock.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An apparatus for aligning a reference signal having a reference phase with a feedback signal having a feedback phase, comprising:

a phase-frequency detector for comparing the reference phase and the feedback phase and for generating a phase-frequency detector output signal that is proportional to a difference between the reference phase and the feedback phase;

a charge pump coupled to said phase-frequency detector for generating a charge pump output signal in response to the phase-frequency detector output signal;

a loop filter coupled to said charge pump for filtering the charge pump output signal, thereby producing a control voltage;

a bias generator coupled to said loop filter for generating a buffered version of the control voltage and for generating a bias signal that is fed back to said charge pump, the bias signal causing said charge pump to output substantially zero current when the reference phase substantially equals the feedback phase; and a voltage-controlled element, controlled by the buffered version of the control voltage and by the bias signal, for generating the feedback signal having the feedback phase substantially aligned with the reference phase, wherein the bias signal generates a first bias current in said voltage-controlled element for biasing said voltage-controlled element, wherein the bias signal generates a second bias current in said charge pump for biasing said charge pump and for generating a second voltage in said charge pump that is substantially equivalent to the control voltage and wherein the first bias current is substantially related to the second bias current.

2. The apparatus of claim 1, wherein said loop filter comprises a capacitor and wherein a ratio of a bandwidth of the apparatus to the reference frequency is determined by a ratio of a capacitance of said loop filter to a capacitance of a delay element in said voltage-controlled element, thereby enabling the bandwidth of the apparatus to be set at substantially a factor of N below a nominal operating frequency.

3. The apparatus of claim 2, wherein said voltage-controlled element comprises a voltage-controlled oscillator (VCO) and wherein a damping factor associated with the apparatus is determined by the ratio of the capacitance of said loop filter to the capacitance of said delay element in said VCO.

4. The apparatus of claim 1, wherein said phase-frequency detector further comprises:

means for generating a first output if the reference signal leads the feedback signal; and means for generating a second output if the reference signal lags the feedback signal.

5. The apparatus of claim 1, wherein said voltage-controlled element comprises a voltage-controlled oscillator (VCO).

6. The apparatus of claim 5, further comprising a second charge pump having an input coupled to an output of said phase-frequency detector and an output coupled to an input of said VCO wherein said second charge pump is biased by the bias signal that is generated by said bias generator, said second charge pump having an effective resistance for adjusting a bandwidth and a damping factor of the apparatus.

7. The apparatus of claim 6, wherein a damping factor of the apparatus is determined by a ratio of a capacitance of said loop filter to a capacitance of a delay element of said VCO.

8. The apparatus of claim 1, wherein said voltage-controlled element comprises a voltage-controlled delay line.

9. The apparatus of claim 8, wherein:

said phase-frequency detector, said charge pump, said low pass filter, said bias generator and said voltage-controlled delay line form a first loop, said first loop further comprising a multiplexer for selecting between the reference signal and the feedback signal as the input of said voltage-controlled delay line and a divide-by-N circuit for dividing a frequency of the feedback signal by an amount, N; and wherein the apparatus further comprises a second loop formed by a second phase-frequency detector, a second charge pump, a second loop filter, a second bias generator, and a second voltage-controlled delay line, said second loop configured substantially similar to said first loop, said second loop further comprising a buffer coupled to said second voltage-controlled delay line for amplifying an output of said second voltage-controlled delay line, thereby producing a buffered output, and a second divide-by-N circuit for dividing a frequency of the buffered output by the amount N, thereby producing a divided-by-N buffered output, wherein a phase of the divided-by-N buffered output is substantially equivalent to the phase of the reference signal.

10. An apparatus for generating an output signal that is substantially in phase with an input signal and that has a frequency that is substantially equal to in integral multiple, N, of the frequency of the input signal, comprising:

a first loop for generating a first loop output signal that has a frequency that is substantially equal to the integral multiple, N, of the frequency of the input signal, said first loop comprising a multiplexer comprising a first input for receiving the input signal, a second input for receiving a feedback signal and a control input for selecting a signal from one of said first input and said second input for output as a multiplexer output signal, a voltage-controlled element for receiving the multiplexer output signal, for generating the first loop output signal and the feedback signal and for adjusting a phase of the first loop output signal and the feedback signal in accordance with the phase of the multiplexer output signal, wherein the first loop output signal and the feedback signal have a frequency that is substantially equal to the multiple, N, of the frequency of the input signal, a divide-by-N circuit for dividing the frequency of the feedback signal by the integral multiple N, a phase-frequency detector for receiving the input signal and the divided-by-N feedback signal, for comparing a phase of the divided-by-N feedback signal with a phase of the input signal and for generating a phase-frequency detector output signal that is proportional to an amount by which the divided-by-N feedback signal leads or lags the phase of the input signal, and means for controlling said voltage-controlled element with the phase-frequency detector output signal; and a second loop coupled to said first loop for generating the output signal from the first loop output signal, wherein the output signal is substantially in phase with the input signal and has a frequency that is substantially equal to the integer multiple, N, of the frequency of the input signal.

11. An apparatus for generating an output signal that is substantially in phase with an input signal and that has a frequency that is substantially equal to an integral multiple, N, of the frequency of the input signal, comprising:

a first loop for receiving the input signal and for generating a first loop output signal that has a frequency that is substantially equal to the integral multiple, N, of the frequency of the input signal; and a second loop coupled to said first loop for generating the output signal from the first loop output signal, wherein the output signal is substantially in phase with the input signal and has a frequency substantially equal to the integer multiple, N, of the frequency of the input signal, said second loop comprising;

a voltage-controlled element for receiving the first loop output signal, for generating a voltage-controlled element output signal and for adjusting a phase of the voltage-controlled element output signal in accordance with a phase of said first loop output signal, wherein said voltage-controlled element output signal has a frequency that is substantially equal to the integer multiple, N, of the frequency of the input signal, a distribution buffer coupled to said voltage-controlled element for amplifying the voltage-controlled element output signal and for generating both a feedback signal and the output signal, a divide-by-N circuit for dividing a frequency of the feedback signal by the integer multiple N, a phase-frequency detector for receiving the input signal and the divided-by-N feedback signal, for comparing a phase of the input signal with a phase of the divided-by-N feedback signal and for generating a phase-frequency detector output signal that is proportional to an amount by which the divided-by-N feedback signal leads or lags the input signal, and means for controlling said voltage-controlled element with the phase-frequency detector output signal.

12. The apparatus of claim 10, wherein said means for controlling said voltage-controlled element with the phase-frequency detector output signal comprises:

a charge pump for generating a charge pump output current having a substantially linear relationship with the output of said phase-frequency detector; and a loop filter for filtering the charge pump output current, thereby producing a control voltage for controlling said voltage-controlled element.

13. A method for substantially eliminating jitter and offset between an input signal and an output signal in a phase-locked or delay-locked loop, comprising the steps of:

(1) determining a phase difference between the input signal and a feedback signal;

(2) generating a difference signal having a substantially linear relationship with respect to the phase difference using a first circuit that generates a bias current from a bias input, the first circuit using the bias current to generate the difference signal;

(3) filtering the difference signal to generate a control voltage;

(4) generating a bias corresponding to the control voltage using a second circuit and coupling the bias to the bias input of the first circuit; and (5) generating the output signal based on the control voltage using a third circuit, the output signal having a phase substantially equal to the input signal.

14. A computer system comprising:

a bus;

a memory coupled to said bus; and a phase-locked loop coupled to said bus for aligning a reference signal having a reference phase with a feedback signal having a feedback phase, said phase-locked loop comprising, a phase-frequency detector for comparing the reference phase and the feedback phase and for generating a phase-frequency detector output signal that is proportional to a difference between the reference phase and the feedback phase;

a charge pump coupled to said phase-frequency detector for generating a charge pump output signal in response to said phase-frequency detector output signal, wherein said charge pump output signal varies in a substantially linear manner with respect to the phase frequency detector output signal, a loop filter coupled to said charge pump for filtering the charge pump output, thereby producing a control voltage, a bias generator coupled to said loop filter for generating a buffered version of the control voltage and for generating a bias signal that is fed back to said charge pump, the bias signal causing said charge pump to output substantially zero current when the reference phase substantially equals the feedback phase, and a voltage-controlled element, controlled by the buffered version of the control voltage and by the bias signal, for modifying the feedback signal such that the feedback phase and the reference phase are substantially aligned, wherein the bias signal generates a first bias current in said voltage-controlled element for biasing said voltage-controlled element, wherein the bias signal generates a second bias current in said charge pump for biasing said charge pump and for generating a second voltage in said charge pump that is substantially equivalent to the control voltage and wherein the first bias current is substantially equivalent to the second bias current.

15. The method of claim 13, wherein step (3) comprises the step of:

generating the control voltage as a proportion of a square root of the bias current in the first circuit.

16. The method of claim 13, further comprising the step of:

(6) establishing a delay through the phase-locked or delay-locked loop that is inversely proportional to the control voltage and inversely proportional to a square root of a bias current in the third circuit.

17. The method of claim 13, further comprising the step of:

(6) establishing a bandwidth of the phase-locked or delay-locked loop based on a ratio of capacitances.

18. The method of claim 17, wherein step (6) comprises the step of:

establishing the bandwidth of the phase-locked or delay-locked loop based on a ratio of a capacitance used for said filtering in step (3) and a capacitance of the third circuit.

19. The method of claim 13, further comprising the step of:

(6) establishing a damping factor in the phase-locked or delay-locked loop which is dependent on a ratio of capacitances.

20. The method of claim 19, wherein step (6) comprises the step of:

establishing the damping factor based on a ratio of a capacitance used for said filtering in step (3) and a capacitance of the third circuit.

21. The method of claim 13, further comprising the step of:

(6) biasing the first circuit with the bias current generated in the first circuit to substantially eliminate phase offsets.

22. The apparatus of claim 1, wherein said phase frequency detector comprises:

an UP output;

a DN output;

a first NAND gate for generating a small pulse at said UP output for every pulse at said DN output; and a second NAND gate for generating a a small pulse at said DN output for every pulse at said UP output, wherein for in-phase inputs to said phase frequency detector, two small pulses of equal duration are generated by said first and second NAND gates which cancel each other in said charge pump and wherein for even a very small phase difference input into said phase frequency detector, small pulses generated at said UP and DN outputs are not equal and are of sufficient duration to permit said charge pump to form a valid current output representative of the very small phase difference input into said phase frequency detector and wherein said charge pump output varies in a substantially linear manner with respect to said phase-frequency detector output.

* * * * *